(12) United States Patent
Goodner et al.

(10) Patent No.: US 6,682,989 B1
(45) Date of Patent: Jan. 27, 2004

(54) PLATING A CONDUCTIVE MATERIAL ON A DIELECTRIC MATERIAL

(75) Inventors: Michael D. Goodner, Hillsboro, OR (US); Grant Kloster, Lake Oswego, OR (US); Steven W. Johnston, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/300,378

(22) Filed: Nov. 20, 2002

(51) Int. Cl.[7] .................. H01L 21/76; H01L 21/463
(52) U.S. Cl. .................. 438/454; 438/637; 438/738
(58) Field of Search .................. 438/454, 99, 637, 438/738, 645, 656, 628, 638, 639, 737, 925, 529, 530

(56) References Cited

U.S. PATENT DOCUMENTS

| | | | | |
|---|---|---|---|---|
| 5,026,135 A | * | 6/1991 | Booth | 385/130 |
| 5,156,938 A | * | 10/1992 | Foley et al. | 430/200 |
| 5,393,651 A | * | 2/1995 | Hoshi | 430/526 |
| 5,501,938 A | * | 3/1996 | Ellis et al. | 430/201 |
| 5,512,131 A | * | 4/1996 | Kumar et al. | 438/738 |
| 5,530,264 A | * | 6/1996 | Kataoka et al. | 257/40 |
| 5,599,742 A | * | 2/1997 | Kadomura | 438/637 |
| 5,648,191 A | * | 7/1997 | Kato et al. | 430/49 |
| 5,724,187 A | * | 3/1998 | Varaprasad et al. | 359/608 |
| 5,769,996 A | * | 6/1998 | McArdle et al. | 156/272.4 |
| 5,948,484 A | * | 9/1999 | Gudimenko et al. | 427/489 |
| 6,060,338 A | * | 5/2000 | Tanaka et al. | 438/99 |
| 6,066,424 A | * | 5/2000 | Kato | 430/49 |
| 6,191,353 B1 | * | 2/2001 | Shiotsuka et al. | 136/256 |
| 6,306,563 B1 | * | 10/2001 | Xu et al. | 430/321 |
| 6,320,115 B1 | * | 11/2001 | Kataoka et al. | 136/251 |
| 6,414,236 B1 | * | 7/2002 | Kataoka et al. | 136/251 |
| 6,468,657 B1 | * | 10/2002 | Hou et al. | 428/403 |
| 6,638,833 B1 | * | 10/2003 | Vassalli et al. | 438/454 |

* cited by examiner

Primary Examiner—Michael S. Lebentritt
(74) Attorney, Agent, or Firm—Trop, Pruner & Hu, P.C.

(57) ABSTRACT

A surface may be selectively coated with a polymer using an induced surface grafting or polymerization reaction. The reaction proceeds in those regions that are polymerizable and not in other regions. Thus, a semiconductor structure having organic regions and metal regions exposed, for example, may have the organic polymers formed selectively on the organic regions and not on the unpolymerizable or metal regions.

14 Claims, 3 Drawing Sheets

PLATING A CONDUCTIVE MATERIAL ON A DIELECTRIC MATERIAL

BACKGROUND

This invention relates generally to processes for manufacturing semiconductor integrated circuits.

Copper seed layers are generally deposited on Cu diffusion barrier materials to enable those materials to receive copper electroplating. However, as silicon processes move to ever smaller features, the ability to deposit copper seed layers, for example using physical vapor deposition techniques, with minimal overhang and asymmetry, adequate sidewall coverage and a sufficient field thickness for gap fill is increasingly in doubt.

Physical vapor deposition of barrier materials has associated overhang, asymmetry, and sidewall coverage issues prior to copper electroplating. Physical vapor deposition of copper seed layers may further reduce the plating budget within a given feature. Alternatively, a wafer may be immersed in a palladium solution to chemically activate the surface prior to electroless plating of a copper or a copper diffusion barrier. However, this involves an additional chemical expense, process step and bath recycle requirements prior to electroless barrier deposition.

In general there is a need for better ways to form materials on dielectric materials.

DETAILED DESCRIPTION

Figure 1:
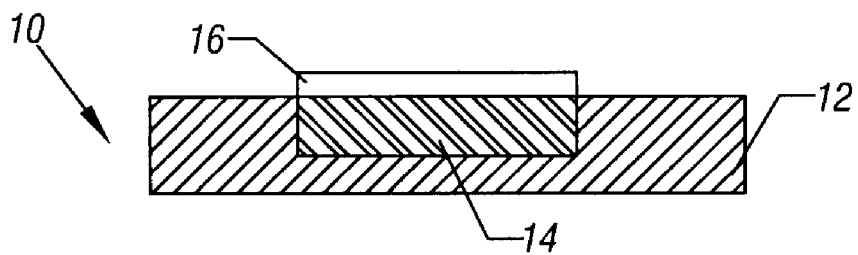
FIG. 1 is an enlarged cross-sectional view at an early stage of fabrication in accordance with one embodiment of the present invention.

In accordance with various embodiments of the present invention, a semiconductor wafer may include a semiconductor substrate having a dielectric material 12, such as an interlevel dielectric (ILD), formed thereon as shown in FIG. 1. The material 12 may be an ultra low dielectric constant material, such as carbon doped oxide (CDO), or the material may be a sacrificial dielectric, as another example. The material 12 may be exposed on an upper surface. Also exposed thereon is a disparate material 14, such as a metal material. The material 14 may be a copper filled trench in one embodiment. A copper or other metal shunt 16 may be formed over the material 14 in one embodiment.

Figure 2:
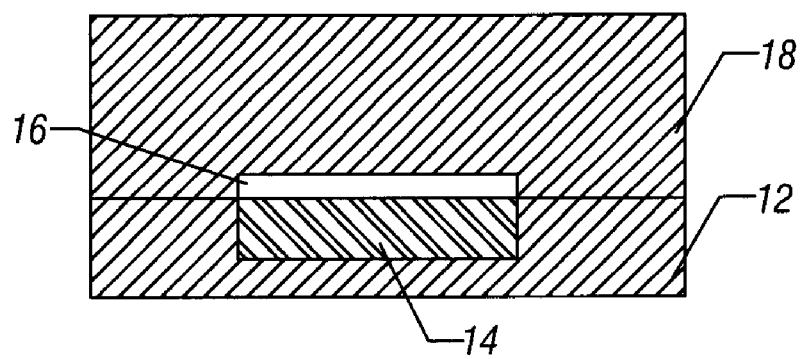
FIG. 2 is an enlarged cross-sectional view of the structure shown in FIG. 1 at a subsequent stage in accordance with one embodiment of the present invention.

A second level interlayer dielectric material 18 may then be deposited over the layer 12, for example in accordance with the well known damascene process as shown in FIG. 2. Of course, the techniques described herein can be applied to any layer of a multi-layer structure. Again, the material 18 may be an ultra low dielectric constant dielectric material or a sacrificial dielectric, as two examples.

Figure 3:
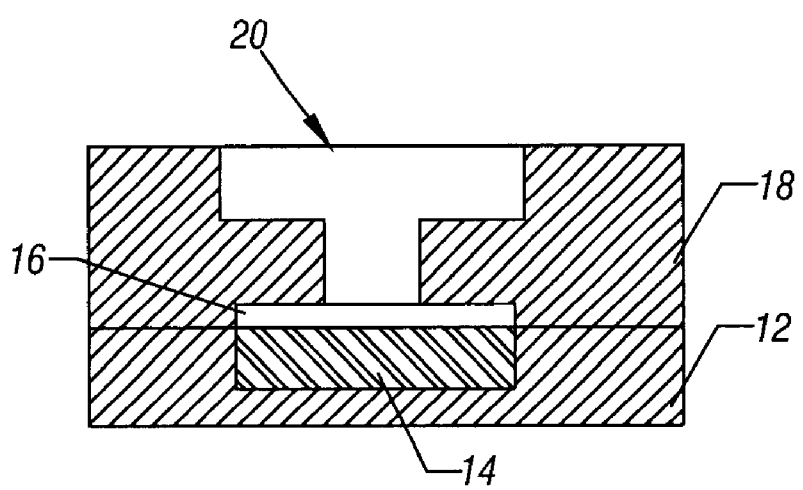
FIG. 3 is an enlarged cross-sectional view of the embodiment shown in FIG. 2 at a subsequent stage in accordance with one embodiment of the present invention.
Figure 4:
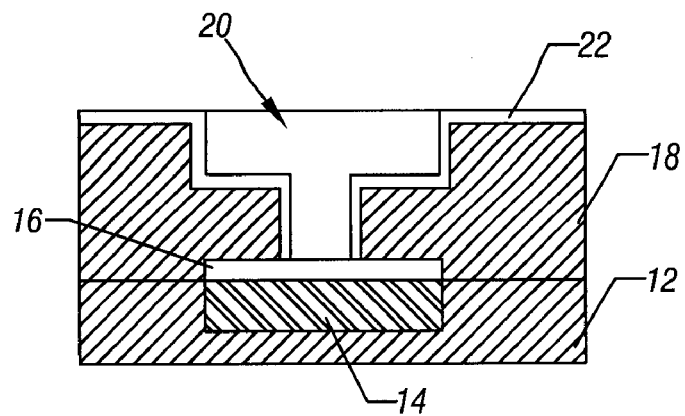
FIG. 4 is an enlarged cross-sectional view of the structure shown in FIG. 3 at a subsequent stage in accordance with one embodiment of the present invention.

Referring to FIG. 3, using trench and via techniques including lithography, etching, and cleaning, a T-shaped trench 20 may be formed in the material 18 as shown in FIG. 3 in one embodiment. As shown in FIG. 4, a conductive polymer 22 may be selectively deposited on the exposed surfaces of the dielectric 18 while avoiding deposition on the exposed surface of a shunt 16 made of a disparate material such as a metal. One technique for forming the selective deposition of a conductive polymer is described in greater detail in connection with FIGS. 6 through 9.

Figure 5:
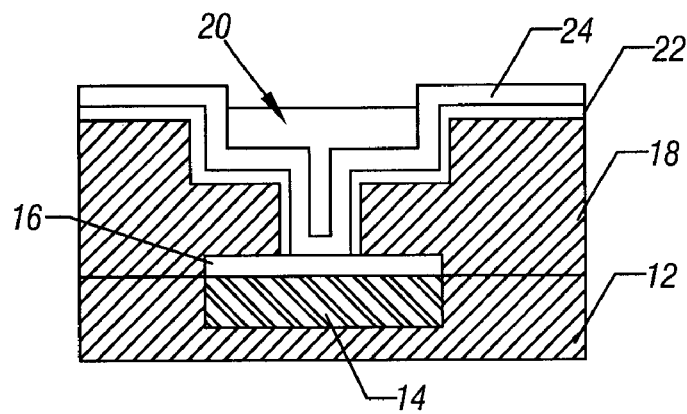
FIG. 5 is an enlarged cross-sectional view at a subsequent stage of the structure shown in FIG. 4 in accordance with another embodiment of the present invention.

Once the conductive polymer layer 22 has been defined, an electroless deposition step may be achieved to form the layer 24 as shown in FIG. 5. In the case of a dielectric 18 that is capable of acting as a diffusion barrier, the material 24 may be copper or other metal that is deposited by electroless deposition. In the case where the material 18 is not a sufficient diffusion barrier, a copper diffusion barrier, such as electroless cobalt boron phosphorous, may be formed as the layer 24 to act as a diffusion barrier. Thereafter, in the case where the layer 24 is a diffusion barrier, a copper or other metal layer may be deposited over the layer 24.

Through surface grafting, a conductive polymer 22 may be caused to attach to a material with abstractable hydrogen. The materials with abstractable hydrogen may be known as proton donors and examples include organic materials or materials with organic moieties. Dielectric materials, such as the material 18, may commonly have abstractable hydrogen. Conversely, materials, such as a metal, have no such abstractable hydrogen and, therefore, will not be subject to induced photografting or polymerization.

As a result, the polymerization can be caused to occur selectively on the surface where abstractable hydrogen is available such as the dielectric 18. In regions without such abstractable hydrogen, such as where the shunt 16 is exposed, no such polymerization will occur. The polymer may be formed selectively on a surface in some regions and not in others. In some embodiments this may avoid unnecessary photo etching and masking steps, decreasing the cost of the semiconductor processing.

A variety of techniques may be utilized to induce surface grafting and polymerization. For example, photo induced graft polymerization may be achieved using benzophenone moieties. Other examples include radical photopolymerization, hydrogen abstraction on organic surfaces with molecules other than benzophenone, cationic and anionic polymerizations, and azide functionalization, to mention a few examples. In general, it is desirable to induce polymerization on regions that are polymerizable while avoiding polymerization on regions, such as metals, that are not polymerizable.

Figure 6:
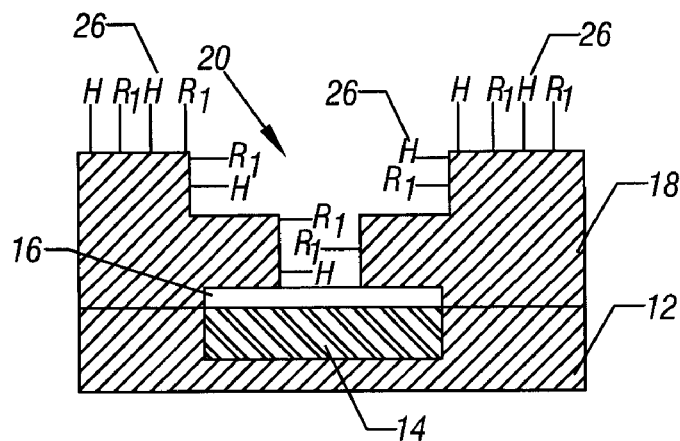
FIG. 6 is an enlarged cross-sectional view illustrating one embodiment for forming the structure shown in FIG. 4.

In accordance with one embodiment of the present invention, photo induced graft polymerization may be implemented using benzophenone to form the conductive polymer layer 22 only over the dielectric 18 and not over the metal shunt 16. Referring to FIG. 6, the dielectric material 18, that has abstactable hydrogen, may have a surface chemistry including hydrogen (H) moieties 26, and organic molecules (e.g., R1), in any of a variety of forms. The material 18 may be coated with a solution of benzophenone and irradiated using ultraviolet radiation at 340 nanometers (nm), in accordance with one embodiment of the present invention. Other wavelengths may also be used such as 365 nm.

Figure 7:
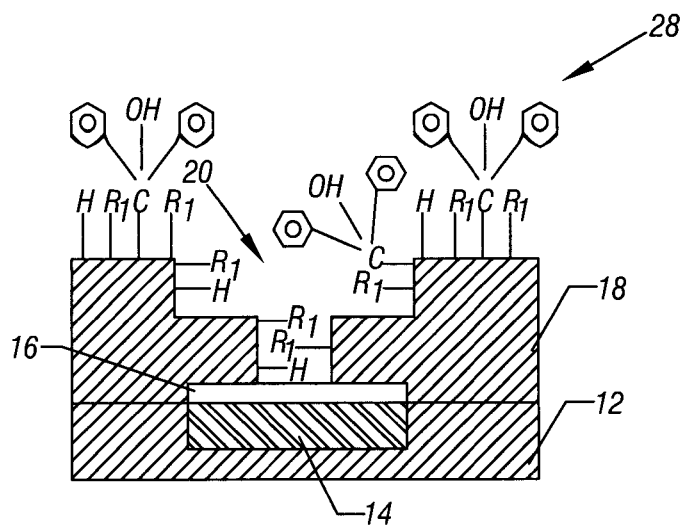
FIG. 7 is an enlarged cross-sectional view of the embodiment shown in FIG. 6 at a subsequent stage in accordance with one embodiment of the present invention.

Ultraviolet radiation breaks down the double bond between the carbon and the oxygen forming a benzophenone derivative reactable with a variety of other organic moieties. Thus, as shown in FIG. 7, as a result of the breakdown of the benzophenone solution, ketal moieties 28 may be attached in place of some of the hydrogen moieties 26 previously present on the surface of the material 18.

Advantageously, the benzophenone solution is provided in a solvent with poor proton donor activity such as benzene. In addition, the solvent is advantageously transparent at the illumination intensities that are utilized.

Of course, the metal shunt 16 surface does not react with the benzophenone via the ultraviolet induced hydrogen abstraction mechanism. Only the organic materials or materials with an abstractable hydrogen are functionalized. The wafer may then be washed with an appropriate rinse solution, such as acetone or methanol, to mention a few examples, to remove excess benzophenone.

Figure 8:
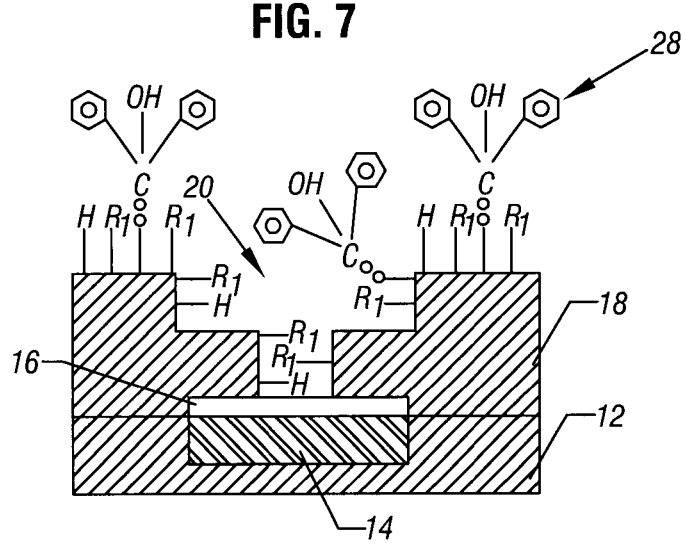
FIG. 8 is an enlarged cross-sectional view of the structure shown in FIG. 7 at a subsequent stage in accordance with one embodiment of the present invention.
Figure 9:
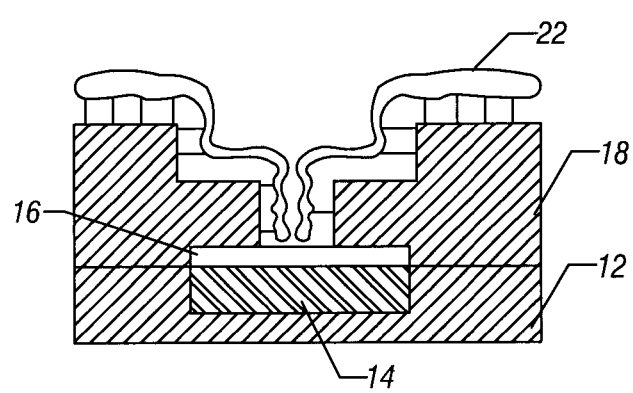
FIG. 9 is an enlarged, schematic, cross-sectional view of the structure shown in FIG. 8 at a subsequent stage in accordance with one embodiment of the present invention.

Next, as shown in FIGS. 8 and 9, a coating material that is susceptible to free radical polymerization is coated over the wafer and the wafer is, again, exposed to ultraviolet light. The free radical benzophenone ketal moieties 28 then serve as a surface photoinitiator, causing in situ polymerization of the coating material. The coating material that is polymerized to form the conductive polymer 22 may be an oligomer end-functionalized with vinyl groups. The oligomer chains may be chosen such that they are conductive enough to act as a seed layer for electroplating or such that they contain moieties that activate electroless deposition of a diffusion barrier, such as a copper diffusion barrier. Examples of conductive oligomers that lead to an activating polymer include polyaniline, polypyrrole, polythiophenes, polyethylenedioxythiophene, and poly(p-phenylene vinylene)s. An example of a monomer for electroless activation includes sigma-4-styrene bis(triphenylphosphine) palladium chloride.

Polymer materials, such as benzocyclobutene, certain polyimides, $NH_3$ post-treated hydrogen silsesquioxane, and carbon doped oxide provide significant resistance to copper diffusion/migration and, therefore, may serve as barriers to copper diffusion. The barrier properties of the dielectric material 18 may be improved by further cross-linking. Electroless plating of barrier material layers may be used if the polymer contains sites that will activate the process. For example, palladium activates CoBP electroless deposition. Copper electroplating directly onto CoBP is well known and does not require a physical vapor deposition copper seed layer. Modification of the dielectric surface to enable electroless plating may be achieved by plasma pretreatment (see M. Charbonnier, M. Alami, and M. Romand, J. Electro. Soc., 143, 472 (1996)), and UV Induced Graft polymerization of Argon plasma-pretreated poly (tetrafluoroethylene) (PTFE) surfaces to improve adhesion (see G. H. Yang, E. T. Kang, and K. G. Neoh, Appl. Surf. Sci., 178, 165 (2001)), as well as simple wafer immersion into $PdCl_2$ bath to catalyze the dielectric surface prior to electroless deposition, (see S. Shingubara, T. Ida, H. Sawa, H. Sakaue, and T. Takahagi, Adv. Metallization Conf. Proc., p. 229 (2000)).

A solvent rinse after exposure removes any unreacted coating material. The conductive polymer 22 is selectively grown on the material 18 as shown in FIG. 9. FIG. 9 shows a nonexistent gap between the polymer 22 and the dielectric 18 solely for illustration purposes.

In general, a compound having a double bond that is susceptible to polymerization, such as free radical polymerization, as an example, may be utilized to form the conductive polymer 22 and to replace the ketal moieties 28 shown in FIG. 8.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a semiconductor substrate having a first exposed polymerizable dielectric surface and a second exposed unpolymerizable surface; and
    causing polymerization to occur selectively on the dielectric surface while avoiding polymerization on the unpolymerizable surface to form a polymer that selectively covers the dielectric surface.

2. The method of claim 1 wherein forming a semiconductor substrate includes forming a semiconductor substrate having a second exposed unpolymerizable surface formed of metal.

3. The method of claim 1 wherein forming a semiconductor substrate having an unpolymerizable surface includes forming a copper surface.

4. The method of claim 2 wherein forming a semiconductor substrate having a first exposed dielectric surface includes forming a surface of interlevel dielectric.

5. The method of claim 1 wherein causing polymerization to occur selectively includes surface grafting polymers to the polymerizable surface.

6. The method of claim 1 wherein causing polymerization to occur includes initiating photo induced graft polymerization.

7. The method of claim 6 including coating said substrate with a substance to induce photo surface grafting and polymerization.

8. The method of claim 7 including coating said surface with benzophenone and irradiating using ultraviolet radiation.

9. The method of claim 7 including forming a benzophenone derivative attached to said polymerizable surface through a hydrogen moiety.

10. The method of claim 1 including forming a copper layer over said conductive polymer.

11. A method comprising:
    forming a semiconductor substrate having a dielectric surface and an exposed metal surface;
    causing polymerization to occur selectively on the dielectric surface while avoiding polymerization on the metal surface to form a polymer that selectively covers the dielectric surface; and
    using the polymer to form a copper diffusion barrier.

12. The method of claim 11 including forming a monomer that activates electroless deposition of a copper diffusion barrier.

13. A method comprising:
    forming a semiconductor substrate having a dielectric surface and a metallic surface;

causing polymerization to occur selectively on the dielectric surface while avoiding polymerization on the metal surface to form a polymer that selectively covers the dielectric surface; and forming a copper seed layer using said polymer.

14. The method of claim 13 including forming said polymer using oligomers end-functionalized with vinyl groups.

* * * * *